United States Patent [19]

Machida

[11] Patent Number: 4,764,749

[45] Date of Patent: Aug. 16, 1988

[54] CMOS ENCODER CIRCUIT

[75] Inventor: Toshiaki Machida, Tokyo, Japan

[73] Assignee: NEC Corporation, Tokyo, Japan

[21] Appl. No.: 943,012

[22] Filed: Dec. 18, 1986

[30] Foreign Application Priority Data

Dec. 20, 1985 [JP] Japan .................................. 60-288762

[51] Int. Cl.⁴ ............................................. H03M 7/00
[52] U.S. Cl. ............................................ 340/347 DD
[58] Field of Search .............................. 307/449, 463; 340/347 DD

[56] References Cited

U.S. PATENT DOCUMENTS 3,945,000 3/1976 Suzuki et al. .................... 307/463 X Primary Examiner—William M. Shoop, Jr.
Assistant Examiner—Richard K. Blum
Attorney, Agent, or Firm—Sughrue, Mion, Zinn, Macpeak & Seas

[57] ABSTRACT

An encoder circuit comprising a plurality of input lines on each of which is to appear a logic "1" or "0" signal bit, a plurality of output lines, a first set of transistors of a first conductivity type, each of the first set transistors having a control terminal connected to each of the input lines and input and output terminals connected between each of the output lines and a supply voltage source, a second set of transistors of a second conductivity type opposite to the first conductivity type, each of the second set transistors having a control terminal connected to each of the input lines and input and output terminals between each of the output lines and ground, and a plurality of logic inverter devices each connected between each of the input lines and each of the transistors of one of the first and second conductivity types.

8 Claims, 6 Drawing Sheets

CMOS ENCODER CIRCUIT

FIELD OF THE INVENTION

The present invention relates to complementary metal-oxide-semiconductor logic circuits and, more particularly, to an encoder circuit implemented by a complementary metal-oxide-semiconductor logic network (hereinafter referred to as CMOS logic network.

BACKGROUND OF THE INVENTION

There are some types of encoder circuits implemented by transistor-transistor logic networks, including those of the static types and those of the dynamic types using CMOS logics. Problems are however encountered in each of such known encoder circuits and have resulted from the fact that the transistor-transistor logic networks forming the encoder circuits must be composed of large numbers of active devices. In the case of dynamic encoder circuits, there is required provision of precharge arrangements, transistor-transistor logics and encoder output hold circuits, all of which also use large numbers of active devices in addition to the transistors forming the encoder circuits per se. The use of such a large number of active devices for an encoder circuit requires the provision of a large device area to implement the encoder circuit on a single semiconductor chip and would further impose significant limitation in reducing the cycle time achievable of the encoder circuit.

SUMMARY OF THE INVENTION

In accordance with one outstanding aspect of the present invention, there is provided an encoder circuit comprising (a) a plurality of input lines on each of which is to appear a logic "1" or "0" signal bit, (b) a plurality of output lines, (c) a first set of transistors of a first conductivity type, each of the first set of transistors having a control terminal connected to each of the input lines and a current path connected between each of the output lines and a supply voltage source, (d) a second set of transistors of a second conductivity type opposite to the first conductivity type, each of the second set of transistors having a control terminal connected to each of the input lines and input and output terminals between each of the output lines and a reference voltage source such as ground, and (e) a plurality of logic inverter devices each connected between each of the input lines and each of the transistors of one of the first and second conductivity types.

In accordance with another outstanding aspect of the present invention, there is provided an encoder circuit comprising (a) a plurality of input lines on which is to appear a signal consisting of bits including only one "0" signal bit, (b) a plurality of output lines, (c) a first transistor zone within which a first set of field-effect transistors of a first conductivity type are located, each of the first set of field-effect transistors having a gate connected to each of the input lines and a current path connected between each of the output lines and a supply voltage source, (d) a second transistor zone within which a second set of field-effect transistors of a second conductivity type opposite to the first conductivity type are located, each of the second set of field-transistors having a gate connected to each of the input lines and a current path connected between each of the output lines and a reference voltage source, and (e) an inverter zone within which a plurality of logic inverter devices are located, each of the logic inverters being connected between each of the input lines and each of the field-effect transistors of one of the first and second sets, (f) the inverter zone intervening between the first and second transistors zones.

BRIEF DESCRIPTION OF THE DRAWINGS

The drawbacks of prior-art encoder circuits and the features and advantages of an encoder circuit according to the present invention will be more clearly understood from the following description taken in conjunction with the accompanying drawings in which.

DESCRIPTION OF THE PRIOR ART

Figure 1:
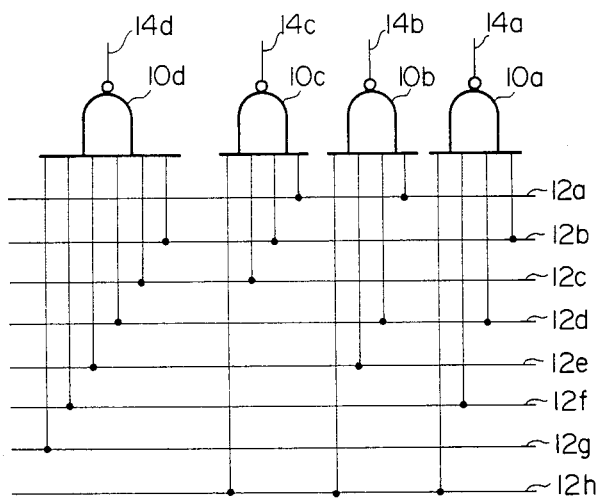
FIG. 1 is a schematic circuit diagram showing an example of a prior-art static-type encoder circuit composed of logic and gates.
Figure 2:
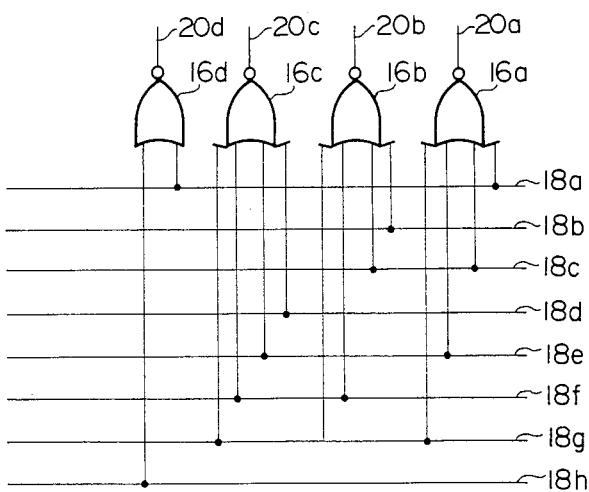
FIG. 2 is a schematic circuit diagram showing an example of a prior-art static-type encoder circuit composed of logic NOR gates.
Figure 3:
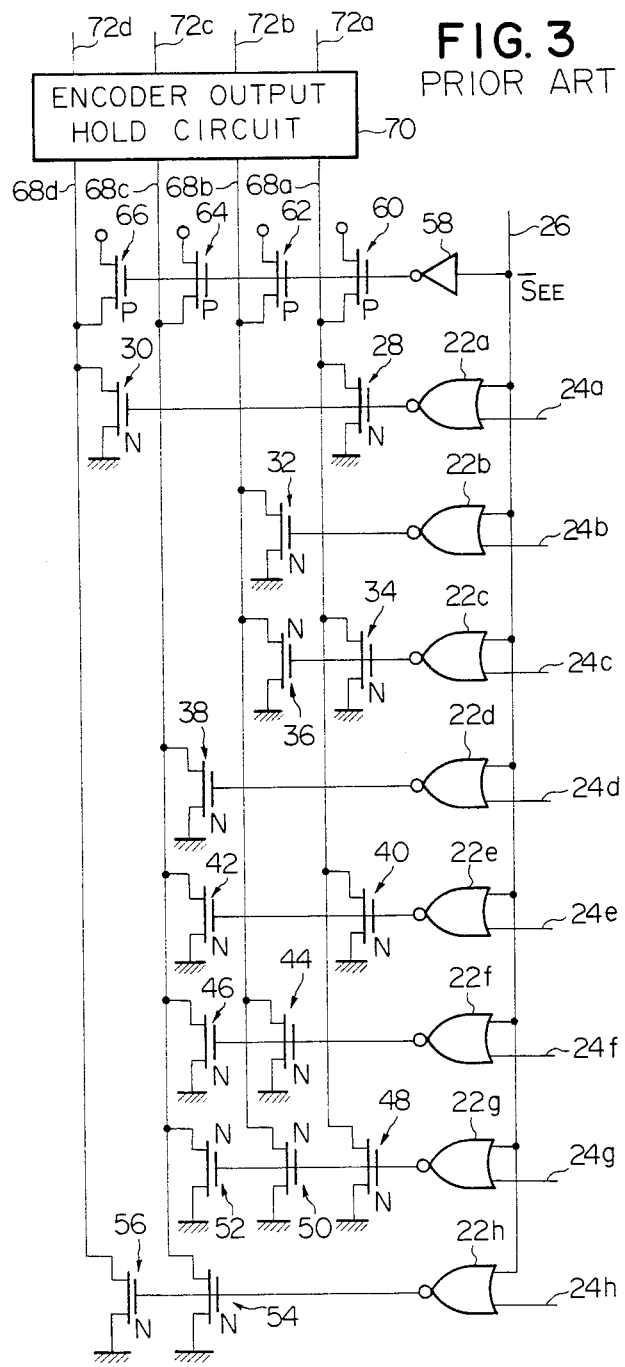
FIG. 3 is a circuit diagram showing schematic circuit diagram showing an example of a prior-art dynamic-type encoder circuit using logic NOR gates.

FIGS. 1 to 3 of the drawings show typical examples of prior-art encoder circuits implemented by transistor-transistor logic networks to which the present invention generally pertains. The encoder circuits shown in FIGS. 1 and 2 are of the static types and the encoder circuit shown in FIG. 3 is of the dynamic type, all the encoder circuits shown being assumed to be of the 8-bit input and 4-bit output designs by way of example.

The encoder circuit shown in FIG. 1 consists of 4-input first, second and third NAND gates 10a, 10b and 10c and a 6-input fourth NAND gate 10d arranged in conjunction with eight, first to eight input lines 12a, 12b, 12c, . . . 12h and four, first to fourth output lines 14a, 14b, and 14c, and 14d. The first NAND gate 10a has its four input terminals respectively connected to the second, fourth, sixth and eighth input lines 12b, 12d, 12f and 12h and its output terminal connected to the first output line 14a. The second NAND gate 10b has its four input terminals respectively connected to the first, fourth, fifth and eighth input lines 12a, 12d, 12e and 12h and its output terminal connected to the second output lines 14b. The third NAND gate 10c has its four input terminals respectively connected to the first, second, third and eighth input lines 12a, 12b, 12c and 12h and its output terminal connected to the third output line 14c. The fourth NAND gate 10d has its sixth input terminals respectively connected to the second to seventh input lines 12b to 12g, respectively, and its output terminal connected to the fourth output line 14c 14d. As is well known in the art, each of these NAND gates 10a, 10b, 10c and 10d is operative to produce at its output terminal a signal of a logic "1" in the presence of a logic "0"

signal at least one of its input terminals and a signal of a logic "0" only in the presence of logic "1" signals at all of its input terminals. As also well known in the art, each of the NAND gates 10a, 10b and 10c typically includes a total of four n-channel field-effect transistors connected in series with an n-channel field-effect transistor serving as a load transistor and, likewise, the fourth NAND gate 10d typically includes a total of sixth n-channel field-effect transistors connected in series with an n-channel field-effect transistor serving as a load transistor.

The encoder circuit shown in FIG. 2 consists of 4-input first, second and third NOR gates 16a, 16b and 16c and a 2-input fourth NOR gate 16d arranged in conjunction with eight, first to eighth input lines 18a, 18b, 18c, ... 18h and four, first to fourth output lines 20a, 20b, 20c and 20d. The first NOR gate 16a has its four input terminals respectively connected to the first, third, fifth and seventh input lines 18a, 18c, 18e and 18g and its output terminal connected to the first output line 20a. The second NOR gate 16b has its four input terminals respectively connected to the second, third, sixth and seventh input lines 18b, 18c, 18f and 18g and its output terminal connected to the second output line 20b. The third NOR gate 16c has its four input terminals respectively connected to the fourth to seventh input lines 18d to 18g and its output terminal connected to the third output lines 20c. The fourth NOR gate 16d has its two input terminals respectively connected to the first and eighth input lines 18a and 18h and its output terminal connected to the fourth output line 20d. As is well known in the art, each of these NOR gates 16a, 16b, 16c and 16d is operative to produce at its output terminal a signal of a logic "0" in the presence of a logic "1" signal at least one of its input terminals and a signal of a logic "1" only in the presence of logic "0" signals at all of its input terminals. As also is well known in the art, each of the NAND gates 16a, 16b and 16c typically includes a total of four p-channel field-effect transistors connected in series with a p-channel field-effect transistor serving as a load transistor and, likewise, the fourth NAND gate 16d typically includes two n-channel field-effect transistors connected in series with a p-channel field-effect transistor serving as a load transistor.

On the other hand, the dynamic encoder circuit shown in FIG. 3 includes 2-input first to eighth NOR gates 22a to 22h. These eight NOR gates 22a to 22h are connected each at one input terminal to first to eighth input lines 24a to 24h and at the other input terminals jointly to an encode enable signal supply line 26 for supplying an encode enable signal $\overline{S}_{EE}$. The first NOR gate 22a has its output terminal connected to the gates of two n-channel field-effect transistors 28 and 30 each having its source connected to ground as shown. The second NOR gate 22b has its output terminal connected to the gate of an n-channel field-effect transistor 32 having its source connected to ground. The third NOR gate 22c has its output terminal connected to the gates of n-channel field-effect transistors 34 and 36 each having its source connected to ground. The fourth NOR gate 22d has its output terminal connected to the gate of an n-channel field-effect transistor 38 having its source connected to ground. The fifth NOR gate 22e has its output terminal connected to the gates of two n-channel field-effect transistors 40 and 42 each having its source connected to ground. The sixth NOR gate 22f has its output terminal connected to the gates of two n-channel field-effect transistors 44 and 46 each having its source connected to ground. The seventh NOR gate 22g has its output terminal connected to the gates of three n-channel field-effect transistors 48, 50 and 52 each having its source connected to ground. Furthermore, the eighth NOR gate 22h has its output terminal connected to the gates of two n-channel field-effect transistors 54 and 56 each having its source connected to ground. On the other hand, the encode enable signal supply line 26 is further connected through an inverter 58 to the gates of four p-channel precharge field-effect transistors 60, 62, 64 and 66 each having its source connected to a supply voltage source ($V_{DD}$) which is symbolically represented in the form of a bubble. The n-channel field-effect transistors 28, 34, 40 and 48 having their gates connected to the first, third, fifth and seventh NOR gates 22a, 22c, 22e and 22g and the p-channel precharge field-effect transistor 60 connected through the inverter 58 to the encoder enable signal supply line 26 have their drains connected to a first encoder output lines 68a. The n-channel field-effect transistors 32, 36, 44 and 50 having their gates connected to the second, third, sixth and seventh NOR gates 22b, 22c, 22f and 22g and the p-channel precharge field-effect transistor 62 connected through the inverter 58 to the encoder enable signal supply line 26 have their drains connected to a second encoder output line 68b. The n-channel field-effect transistors 38, 42, 46, 52 and 54 having their gates connected to the fourth, fifth, six, seventh and eighth NOR gates 22d, 22e, 22f, 22g and 22h and the p-channel precharge field-effect transistor 64 connected through the inverter 58 to the encoder enable signal supply line 26 have their drains connected to a third encoder output line 68c. Furthermore, the n-channel field-effect transistors 30 and 56 having their gates connected to the first and eighth NOR gates 22a and 22h and the p-channel precharge field-effect transistor 66 connected through the inverter 58 to the encoder enable signal supply line 26 have their drains connected to a fourth encoder output line 68d. The first to fourth encoder output lines 68a to 68d terminate in an encoder output hold circuit 70 which has four output terminals 72a, 72b, 72c and 72d as shown.

The encode enable signal $\overline{S}_{EE}$ is an active-low logic signal and activates each of the p-channel precharge field-effect transistors 60, 62, 64 and 66 through their inverter 58 when swung to a high level prior to each encoding cycle of operation for precharging each of the output lines 68a to 68d to a level approximating the supply voltage $V_{DD}$. During precharge cycles of operation with the encode enable signal $\overline{S}_{EE}$ thus swung to high level, each of the first to eighth NOR gates 22a to 22h is conditioned to produce a logic "0" output signal so that all of the n-channel field-effect transistors 28 to 56 included in the encoder circuit are held in non-conduction state.

There are problems in each of the known encoder circuits implemented by transistor-transistor logic networks. Each of the NAND gates 10a to 10d or the NOR 16a to 16d of the prior-art static encoder circuit shown in FIG. 1 or 2 is usually composed of a plurality of n-channel or p-channel driver field-effect transistors in addition to a load transistor as discussed previously. The use of such a large number of active devices for an encoder circuit not only requires the provision of a large total device area to implement the encoder circuit on a single semiconductor chip but would make it difficult to significantly reduce the cycle time achievable of the encoder circuit. On the other hand, the known dynamic encoder circuit of the configuration shown in FIG. 3 requires not only the driver transistors 28 to 56 but also a large number of field-effect transistors for forming the NOR gates 22a to 22h and the precharge arrangement including the inverter 58 and p-channel transistors 60 to 66 as well as the active devices for forming the encoder output hold circuit 70. This also requires the provision of a large device area to implement the encoder circuit on a single semiconductor chip and would further make it difficult to reduce the cycle time of the encoder circuit.

Figure 4:
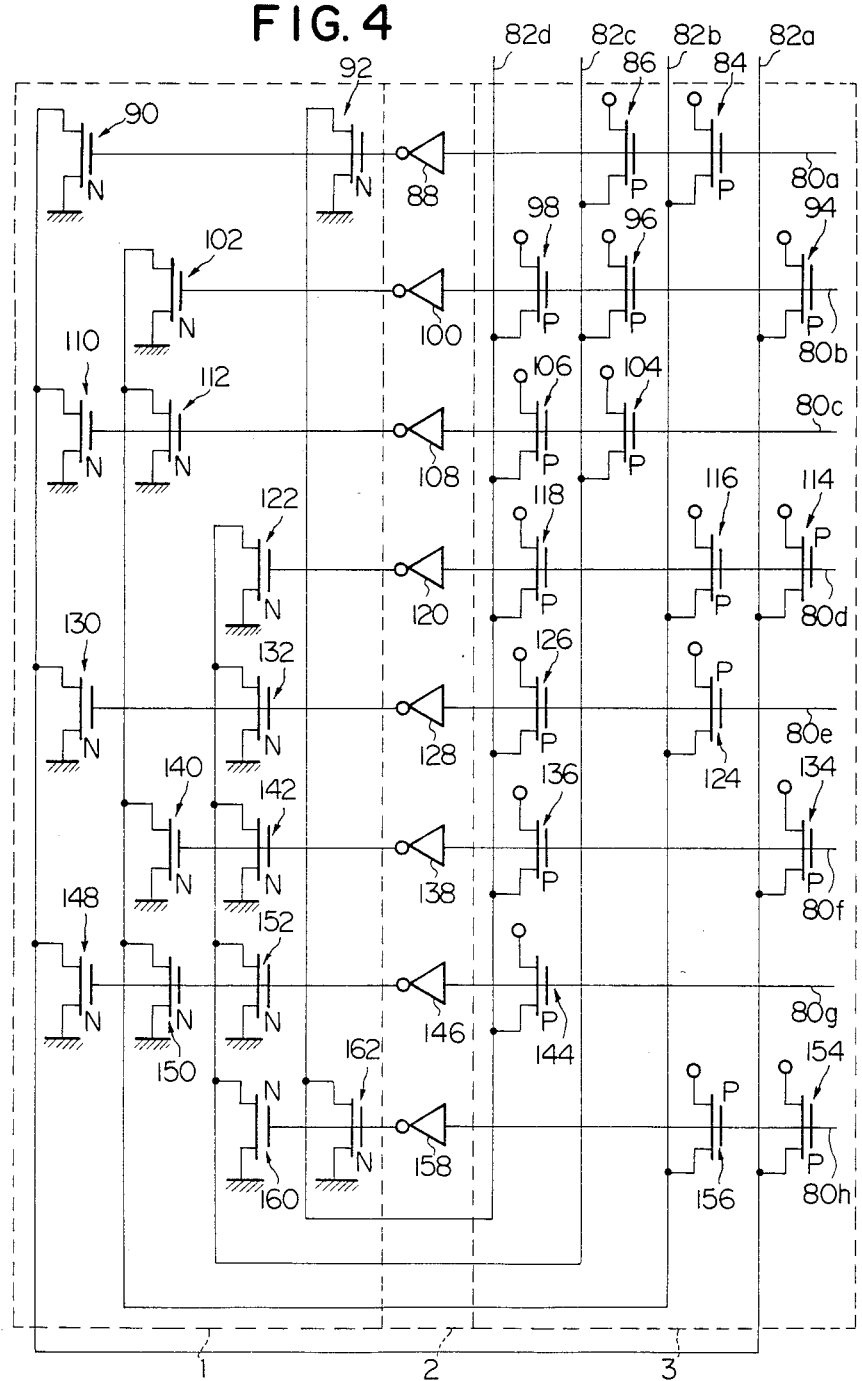
FIG. 4 is a circuit diagram showing a preferred embodiment of an encoder circuit according to the present invention.

FIG. 4 of the drawings show a preferred embodiment of an encoder circuit according to the present invention to overcome these problems of prior-art encoder circuits implemented by transistor-transistor logic networks.

DESCRIPTION OF THE PREFERRED EMBODIMENTS

Referring to FIG. 4 of the drawings, a CMOS encoder circuit embodying the present invention is assumed as being implemented by an eight-bit input and four-bit output designs by way of example. The encoder circuit is thus shown provided in conjunction with first to eighth input lines 80a, 80b, 80c, . . . 80h and four encoder output lines 82a, 82b, 82c and 82d. Of these four encoder output lines, the lines 82a and 82d in particular are assumed to be LSB (least significant bit) and MSB (most significant bit) lines, respectively.

The first input line 80a is connected to the gates of two p-channel field-effect transistors 84 and 86 and through an inverter 88 to the gates of two n-channel field-effect transistors 90 and 92, each of the p-channel transistors 84 and 86 having its source connected to a supply voltage source and each of the n-channel transistors 90 and 92 having its source connected to ground. The second input line 80b is connected to the gates of three p-channel field-effect transistors 94, 96 and 98 and through an inverter 100 to the gates of one n-channel field-effect transistor 102, each of the p-channel transistors 94, 96 and 98 having its source connected to the supply voltage source and the n-channel transistor 102 having its source connected to ground. The third input line 80c is connected to the gates of two p-channel field-effect transistors 104 and 106 and through an inverter 108 to the gates of two n-channel field-effect transistors 110 and 112, each of the p-channel transistors 104 and 106 having its source connected to the supply voltage source and each of the n-channel transistors 110 and 112 having its source connected to ground. The fourth input line 80d is connected to the gates of three p-channel field-effect transistors 114, 116 and 118 and through an inverter 120 to the gates of one n-channel field-effect transistor 122, each of the p-channel transistors 114, 116 and 118 having its source connected to the supply voltage source and the n-channel transistor 122 having its source connected to ground. On the other hand, the fifth input line 80e is connected to the gates of two p-channel field-effect transistors 124 and 126 and through an inverter 128 to the gates of two n-channel field-effect transistors 130 and 132, each of the p-channel transistors 124 and 126 having its source connected to the supply voltage source and each of the n-channel transistors 130 and 132 having its source connected to ground. Likewise, the sixth input line 80f is connected to the gates of two p-channel field-effect transistors 134 and 136 and through an inverter 138 to the gates of two n-channel field-effect transistors 140 and 142, each of the p-channel transistors 134 and 136 having its source connected to the supply voltage source and each of the n-channel transistors 140 and 142 having its source connected to ground. The seventh input line 80g is connected to the gates of one p-channel field-effect transistor 144 and through an inverter 146 to the gates of three n-channel field-effect transistors 148, 150 and 152, the p-channel transistor 144 having its source connected to the supply voltage source and each of the n-channel transistors 148, 150 and 152 having its source connected to ground. Furthermore, the eighth input line 80h is connected to the gates of two p-channel field-effect transistors 154 and 156 and through an inverter 158 to the gates of two n-channel field-effect transistors 160 and 162, each of the p-channel transistors 154 and 156 having its source connected to the supply voltage source and each of the n-channel transistors 160 and 162 having its source connected to ground.

The p-channel field-effect transistors 94, 114, 134 and 154 having their gates respectively connected to the second, fourth, sixth and eighth input lines 80b, 80d, 80f and 80h have their drains jointly connected to the first encoder output line 82a. The n-channel field-effect transistors 90, 110, 130 and 148 having their gates respectively connected through the inverters 88, 108, 128 and 146 to the first, third, fifth and seventh input line 80a, 80c, 80e and 80g also have their drains jointly connected to the first encoder output line 82a. The p-channel field-effect transistors 84, 116, 124 and 156 having their gates respectively connected to the first, fourth, fifth and eighth input lines 80a, 80d, 80e and 80h have their drains jointly connected to the second encoder output line 82b. The n-channel field-effect transistors 102, 112, 140 and 150 having their gates respectively connected through the inverters 100, 108, 138 and 146 to the second, third, sixth and seventh input line 80b, 80c, 80f and 80g also have their drains jointly connected to the second encoder output line 82b. The p-channel field-effect transistors 86, 96 and 104 having their gates respectively connected to the first, second and third input lines 80a, 80b and 80c have their drains jointly connected to the third encoder output line 82c. The n-channel fieldeffect transistors 122, 132, 142, 152 and 160 having their gates respectively connected through the inverters 120, 128, 138, 146 and 158 to the fourth to eighth input line 80d to 80h also have their drains jointly connected to the third encoder output line 82c. The p-channel field-effect transistors 98, 106, 118, 126, 136 and 144 having their gates respectively connected to the second to seventh input lines 80b to 80g have their drains jointly connected to the fourth encoder output line 82d. The n-channel field-effect transistors 92 and 162 having their gates respectively connected through the inverters 88 and 158 to the first and eighth input line 80a and 80h also have their drains jointly connected to the fourth encoder output line 82d.

FIG. 4 shows not only the circuit arrangement of the transistors and logic inverters implementing the encoder circuit embodying the present invention but also the layout of such devices integrated on a single semiconductor substrate (not shown). The semiconductor integrated circuit structure formed on the substrate thus largely consists of an n-channel field-effect transistor zone 1 within which the n-channel field-effect transistors are located, an inverter zone 2 within which the logic inverters are located, and a p-channel field-effect transistor zone 3 within which the p-channel field-effect transistors are located, as indicated by broken lines. The n-channel and p-channel zones 1 and 3 are formed on both sides of the inverter zone 2 which thus intervenes between the n-channel and p-channel zones 1 and 3 as shown.

One specific mode of operation of the encoder circuit thus constructed and arranged will be hereinafter described on the assumption that a digital input signal "10111111" is applied to the circuit through the input lines 80a to 80h. Thus, there is a signal bit of a logic "0" level appearing at the second input line 80b alone with a logic "1" signal bit applied to each of the other input lines 80a and 80c to 80h. In the presence of the logic "0" bit at the second input line 80b of the shown circuit, each of the p-channel field-effect transistors 94, 96 and 98 is activated to turn on, providing a current path from the supply voltage source to each of the first, third and fourth encoder output lines 82a, 82c and 82d. Among the n-channel field-effect transistors, only the n-channel field-effect transistor 102 associated with the second input line 80b and second encoder output line 82b is activated to turn on in response to the logic "1" bit appearing at the output terminal of the associated inverter 100. All of the other n-channel fieldeffect transistors remain in non-conduction state in the presence of logic "1" signal bits at the output terminals of the associated inverters 88, 108, 120, 128, 138, 146 and 158. Thus, each of the first, third and fourth encoder output lines 82a, 82c and 82d is connected to the supply voltage source and isolated from ground and is thus charged to a logic "1" state. On the other hand, the second encoder output line 82b which remains disconnected from the supply voltage source is connected to ground through the n-channel field-effect transistor 102 and is therefore shifted to a logic "0" state. A four-bit binary signal encoded in the form of "1011" is thus produced in response to the digital input signal "10111111". In a like manner, a four-bit binary signal encoded in the form of "0011" will be produced in response to a digital input signal "11011111" with each of the p-channel field-effect transistors 104 and 106 turned on in association with the third and fourth encoder output lines 82c and 82d, respectively, and each of the n-channel field-effect transistors 112 and 110 turned on in association with the first and second encoder output lines 82a and 82b, respectively. Similarly, a binary signal encoded as "1000" will be produced in response to a digital input signal "11111101" with only the p-channel field-effect transistor 144 turned on in association with the fourth encoder output line 82d and each of the n-channel field-effect transistors 148, 150 and 152 turned on in association with the first, second and third encoder output lines 82a, 82b and 82c, respectively.

As will be appreciated from the foregoing description, the encoder circuit embodying the present invention only necessitates four p-channel and n-channel field-effect transistors, viz., transistors of a number equal to the output lines and a single inverter for each of the input lines. An encoder circuit according to the present invention can thus be implemented simply by field-effect transistors equal the product of the number of the input lines and the number of the output lines and inverters equal in number to the input lines. There is, furthermore, no need of using logic NAND or NOR gates each of which may consist of a series of transistors equal in number to the input lines used as is the case with each of the conventional encoder circuits shown in FIGS. 1 and 2. This will contribute to significant reduction of the total device area of the encoder circuit implemented on a single semiconductor chip. It may also be noted that the encoder circuit operative simply on a single worst, viz., time-consuming signal bit which is applied to only one of the inverters to produce the required encoder output signal. Thus, an encoder circuit according to the present invention is advantageous not only for its potentiality to permit significant reduction of the total device area required to implement the encoder circuit on a single semiconductor chip but for the significantly shortened cycle time achievable of the encoder circuit.

Figure 5:
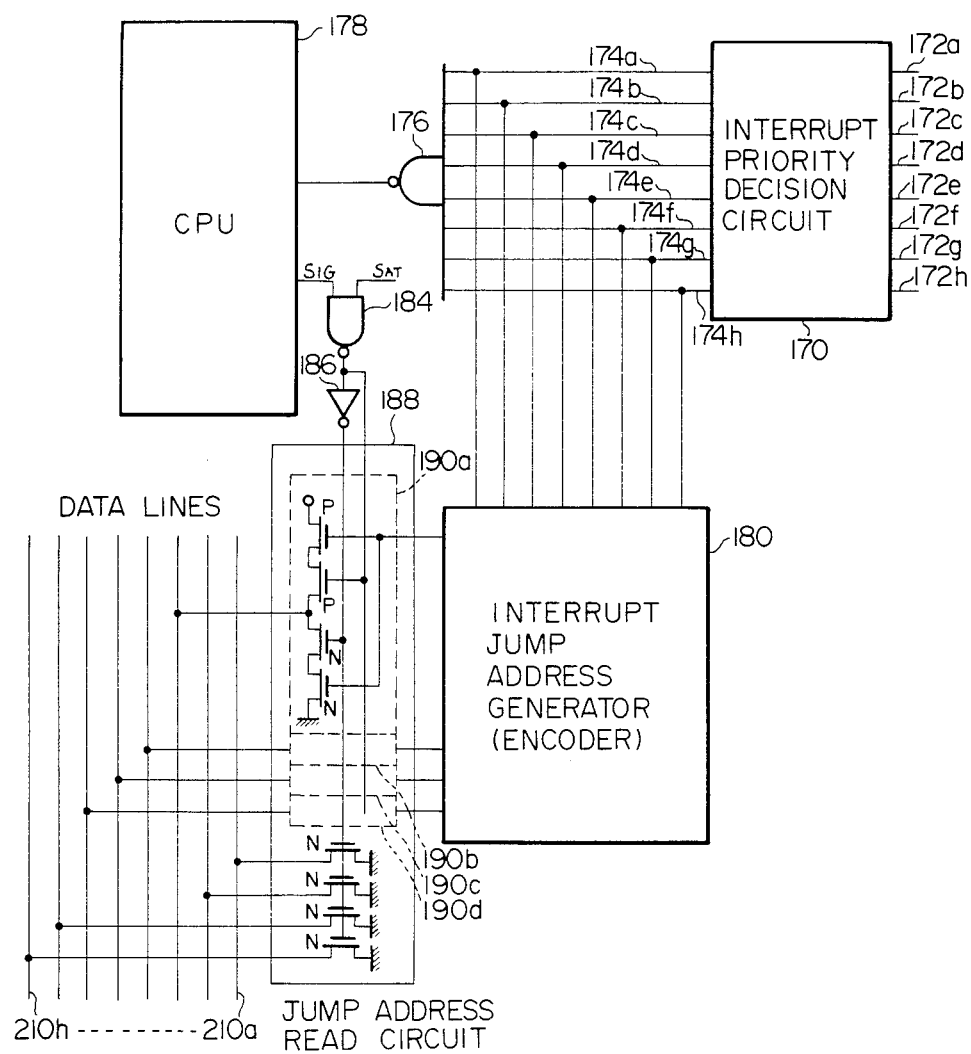
FIG. 5 is a block diagram showing a preferred example of an interrupt control circuitry incorporating the encoder circuit illustrated in FIG. 4.
Figure 5A:
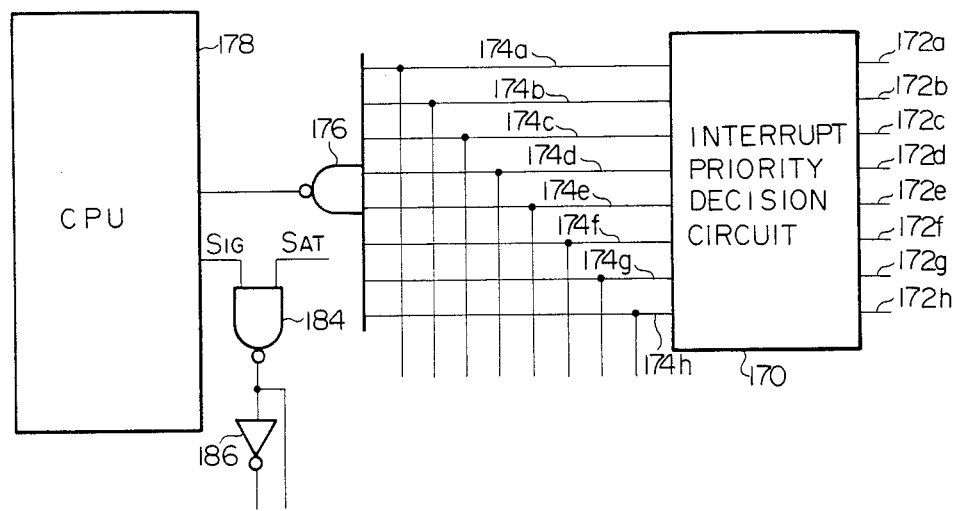
FIG. 5A is a block diagram showing, to an enlarged scale, a portion of the interrupt control circuitry illustrated in FIG. 5.

FIG. 5 of the drawings shows an example of an interrupt control circuitry to which an encoder circuit according to the present invention is applied. As shown in FIG. 5 and to an enlarged scale in FIG. 5A, the interrupt control circuitry comprises an interrupt priority decision circuit 170 having eight input terminals 172a, 172b, 172c, ... 172h and eight output terminals 174a, 174b, 174c, ... 174h. The priority decision circuit 170 is operative to produce a logic "0" signal bit at only one of its output terminals 174a, 174b, 174c, ... 174h and a logic "1" signal bit at each of the remaining output terminals depending upon the level of the interrupt priority determined for each digital signal supplied to the circuit 170 through the input terminals 172a, 172b, 172c, ... 172h. Such an interrupt priority decision circuit 170 per se is well known in the art and, as such, no detailed circuit arrangement thereof is herein shown. A logic signal thus including only one logic "0" bit thus appears at the output terminals 174a, 174b, 174c, ... 174h of the priority decision circuit 170 and is transmitted on one hand to an eight-input NAND gate 176 having an output terminal connected to a microprocessor 178 (CPU) and on the other hand to an interrupt jump address generator circuit 180. The interrupt jump address generator circuit 180 has incorporated therein an encoder circuit constructed and arranged as hereinbefore described with reference to FIG. 4. Accordingly, the address generator circuit 180 has eight input terminals respectively connected to the output terminals 174a, 174b, 174c, ... 174h of the priority decision circuit 170 and four output terminals 182a, 182b, 182c and 182d as shown.

One of eight bits of the binary signal input to the NAND gate 186 being of a logic "0" state, the NAND gate 176 normally supplies a logic "1" output signal requesting the microprocessor 178 for an interrupt. When the interrupt thus requested is granted by the microprocessor 178, an interrupt grant signal $S_{IG}$ of a logic "1" state is supplied to one input terminal of a two-input NAND gate 184, the other input terminal of which is responsive to an interrupt jump address timing signal $S_{AT}$. If this interrupt jump address timing signal $S_{AT}$ is of a logic "1" state, then the NAND gate 184 is conditioned to produce a logic "0" output signal, which is supplied on one hand directly and on the other hand after inversion by an inverter 186 to a jump address read circuit 188.

The jump address read circuit 188 comprises first, second, third and fourth clocked inverter networks 190a, 190b, 190c and 190d connected to the output terminals 182a, 182b, 182c and 182d, respectively, of the interrupt jump address generator circuit 180 and further to the output terminals of the NAND gate 184 and inverter 186. The four clocked inverter networks 190a, 190b, 190c and 190d all have similar circuit arrangements so that the detailed circuit construction of only the first clocked inverter network 190a is herein shown.

Figure 5B:
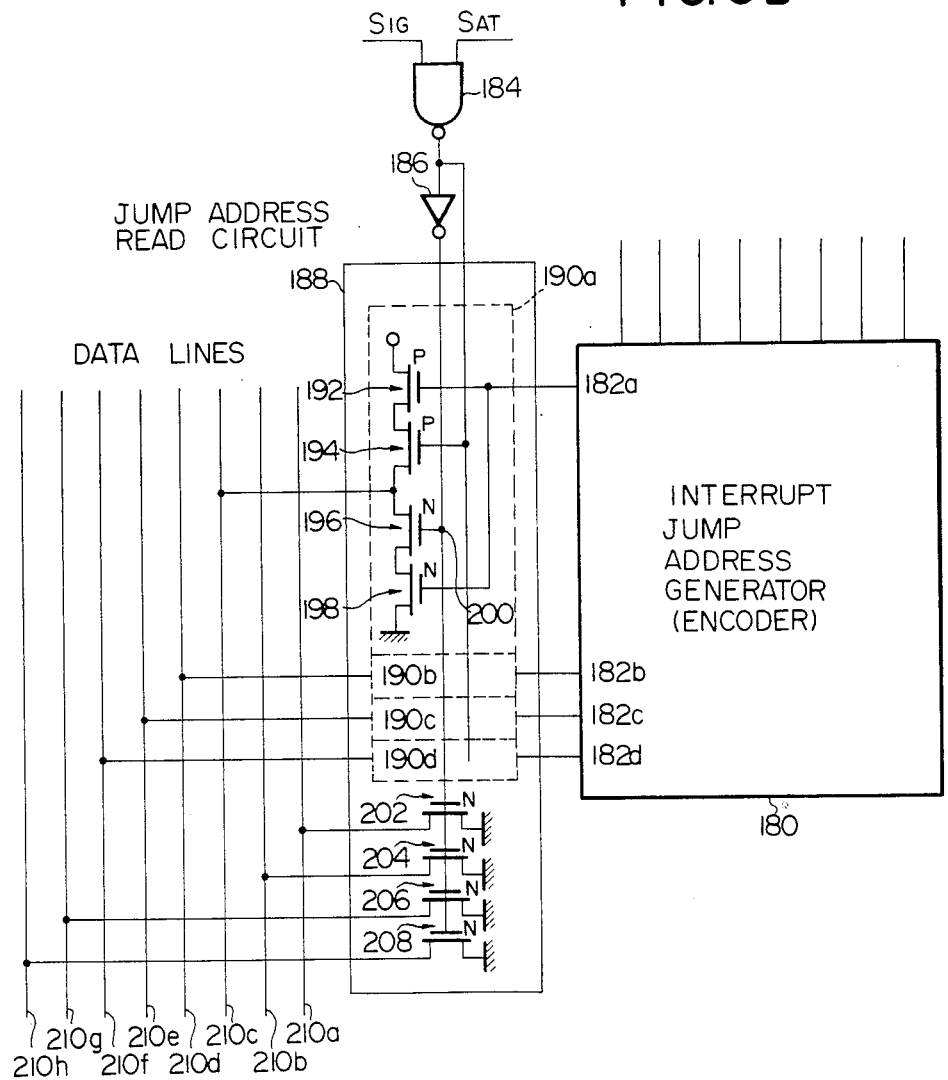
FIG. 5B is a vew similar to FIG. 5A but shows another portion of the interrupt control circuitry illustrated in FIG. 5.

As illustrated to the enlarged scale in FIG. 5B, the first clocked inverter network 190a consists of a series combination of p-channel field-effect transistors 192 and 194 and n-channel field-effect transistors 196 and 198. The p-channel field-effect transistor 192 has its gate connected to the output terminal 182a of the interrupt jump address generator circuit 180 and its source connected to a supply voltage source which is also symbolically represented by a bubble. The n-channel field-effect transistor 194 has its gate connected to the output terminal of the NAND gate 184, it source connected to the drain of the transistor 192 and its drain connected to a node 200. The p-channel field-effect transistor 196 has its gate connected to the output terminal of the inverter 186 and its drain connected to the node 200. The n-channel field-effect transistor 198 has its gate also connected to the output terminal of the NAND gate 184, its drain connected to the source of the transistor 196, and its source connected to ground as shown. In the description to follow, those elements of each of the second, third and fourth clocked inverter networks 190b, 190c and 190d will be referred to with the same reference numerals as those of the transistors 192, 194, 196 and 198 and node 200 of the first clocked inverter network 190a thus constructed.

The jump address read circuit 188 further comprises first, second, third and fourth n-channel field-effect transistors 202, 204, 206 and 208 which have their gates jointly connected to the output terminal of the inverter 186, each of these transistors having its source connected to ground. There is further provided a data bus which comprises eight data line 210a, 210b, 210c, . . . 210h. The first and second data line 210a and 210b are connected to the drains of the field-effect transistors 202 and 204, respectively. The third data line 210c is connected to the node 200 in the first clocked inverter network 190a and likewise each of the fourth, fifth and sixth data lines 210d, 210e and 210f is connected to the similar node in each of the second, third and fourth inverter networks 190b, 190c and 190d. The seventh and eighth data line 210g and 210h are connected to the drains of the field-effect transistors 206 and 208, respectively.

In the presence of a logic "0" signal at the output terminal of the NAND gate 184 as above noted, the p-channel field-effect transistor 194 in the first clocked inverter network 190a and its counterpart in each of the second, third and fourth clocked inverter networks 190b, 190c and 190d are turned on. Furthermore, the n-channel field-effect transistor 196 in the first clocked inverter network 190a and its counterpart in each of the second, third and fourth clocked inverter networks 190b, 190c and 190d are turned on in response to the logic "1" output signal from the inverter 186. On the other hand, there is a certain four-bit binary signal such as "1011" at the output terminals 182a, 182b, 182c and 182d of the interrupt jump address generator circuit 180 in the presence of an eight-bit digital signal such as "10111111" at the output terminals 172a, 174b, 174c, . . . 174h of the interrupt priority decision circuit 170. The four-bit binary signal "1101" thus generated by the jump address generator circuit 180 is fed to the four clocked inverter networks 190a to 190d of the jump address read circuit 188. Thus, a logic "1" signal bit is applied from the first output terminal 182a of the address generator circuit 180 to the gates of the p-channel and n-channel field-effect transistors 192 and 198 of the first clocked inverter network 190a. Likewise, a logic "1" signal bit is applied from each of the second and fourth output terminal 182b and 182d of the address generator circuit 180 to the gates of the transistors 192 and 198 in the second and fourth clocked inverter networks 190b and 190d, respectively. Concurrently, a logic "0" signal bit is applied from the third output terminal 182c of the address generator circuit 180 to the gate of the transistors 192 and 198 of the third clocked inverter network 190c. The p-channel field-effect transistor 192 of the first clocked inverter network 190a and its respective counterparts in the second and fourth clocked inverter networks 190b and 190d are thus allowed to remain in non-conduction state, while the transistor 192 of the third clocked inverter network 190c is activated to turn on. Furthermore, the n-channel field-effect transistor 198 of the first clocked inverter network 190a and its respective counterparts in the second and fourth clocked inverter networks 190b and 190d are turned on, and the transistor 198 of the third clocked inverter network 190c is allowed to remain in non-conduction state. Thus, all the field-effect transistors of the four clocked inverter networks 190a, 190b, 190c and 190d are turned on, except for the p-channel field-effect transistor 192 in the first clocked inverter network 190a and its counterparts in the second and third clocked inverter networks 190b and 190d and the n-channel field-effect transistor 198 of the third clocked inverter network 190c. Under these conditions, the node 200 in the first clocked inverter network 190a is connected to ground through the transistors 196 and 198 and is disconnected from the supply voltage source by the p-channel field-effect transistor 192. The nodes 200 in the second and fourth clocked inverter networks 190b and 190d are also grounded and disconnected from the supply voltage source. On the other hand, the node 200 in the third clocked inverter network 190c is isolated from ground by means of the transistor 198 of the inverter network 190c and is connected to the supply voltage source through the transistor 192 of the network 190c. A logic "0" signal corresponding to ground level thus appears at the third, fourth and sixth data lines 210c, 210d, 210f while a logic "1" signal corresponding to the supply voltage level appears at the fifth data line 210e. On all the other data lines, viz., the first, second, seventh and eighth data lines 210a, 210b, 210g and 210h are provided logic "0" signals with the n-channel field-effect transistors 202, 204, 206 and 208 turned on in response to the logic "1" output signal from the inverter 186. Accordingly, there appears a binary signal in the form of "00001000" on the eight-bit data bus consisting of the lines 210a to 210h.

In the interrupt control circuitry hereinbefore described, the four-bit binary signal output from the encoder circuit described with reference to FIG. 4 is used as the output signal from the interrupt jump address generator circuit 180 and the individual bits of such a signal are supplied to the clocked inverter networks 190a, 190b, 190c and 190d, respectively. The p-channel field-effect transistor 194 and n-channel field-effect transistor 196 of each of these clocked inverter networks depend for their operation on the logic state at the output terminal of the NAND gate 184 provided in association with the inverter networks 190a, 190b, 190c and 190d. Thus, the field-effect transistors 194 and 196 of each clocked inverter network could not be turned on unless the NAND gate 184 is conditioned to produce a logic "0" output signal. Meanwhile, it may happen that a high-impedance state is established on any of the output terminals 182a, 182b, 182c and 182d of the jump address generator circuit 180 so that the p-channel and n-channel field-effect transistors 192 and 194 of the associated clocked inverter network is activated to turn on by a floating voltage appearing at the particular output terminal of the circuit 180. Since the field-effect transistors 194 and 196 of the clocked inverter network could not be turned on in the absence of a logic "0" signal at the output terminal of the NAND gate 184 as above noted, there could not be a current path created from the supply voltage source to ground through the particular inverter network.

The interrupt control circuitry shown in FIG. 5 is further characterized in that the NAND gate 184 operable as above could not be conditioned to produce a logic "0" output signal except when the binary signal output from the interrupt priority decision circuit 170 includes one, and only one logic "0" signal bit. This means that the jump address read circuit 188 is enabled to read the binary output signal from the jump address generator circuit 180 when, and only when the binary signal output from the interrupt priority decision circuit 170 includes a single logic "0" signal bit. Under such a condition, each bit of the four-bit binary signal output from the jump address generator circuit 180 uniquely has either a logic "0" state or a logic "1" state so that the jump address read circuit 188 could not read a high-impedance state from the address generator circuit 180.

While it has been assumed that the encoder circuit shown in FIG. 4 is such that the encoder circuit is enabled to operate in response to an input digital signal including only one logic "0" bit, such an encoder circuit may be modified to be enabled when supplied with a digital signal including only one logic "1" bit. For this purpose, the circuit arrangement of FIG. 4 may be modified so that the eighth input lines 80a, 80b, 80c, . . . 80h for the encoder circuit are connected to the n-channel field-effect transistors directly (viz., without intervention of the inverters 88, 100, 108, 120, 128, 138, 146, 158) and through inverters to the p-channel field-effect transistors.

What is claimed is:

1. An encoder circuit for supplying an encoded signal, comprising
   (a) a plurality of input lines on each of which is to appear a logic "1" or "0" signal, the input lines consisting of a first set of input lines and a second set of input lines respectively connected to the first set of input lines,
   (b) a plurality of output lines,
   (c) a first set of transistors of a first conductivity type, each of the first set of transistors having a control terminal connected to one of said first set of input lines and having a current path connected between one of said output lines and a supply voltage source,
   (d) a second set of transistors of a second conductivity type opposite to said first conductivity type, each of the second set of transistors having a control terminal connected to one of said second set of input lines and having a current path connected between one of said output lines and a reference voltage source, and
   (e) a plurality of logic inverter devices each connected between one of said first set of input lines and one of the second set of input lines,
   whereby the encoded signal is supplied to said output lines in response to the logic signal on said input lines.

2. An encoder circuit for supplying an encoded signal, comprising
   (a) a plurality of input lines on which is to appear a signal consisting of bits including only one "0" signal bit, the input lines consisting of a first set of input lines and a second set of input lines respectively connected to the first set of input lines,
   (b) a plurality of output lines,
   (c) a set of p-channel field-effect transistors each of which has a gate connected to one of said first set of input lines and has a current path connected between one of said output lines and a supply voltage source,
   (d) a set of n-channel field-effect transistors each of which has a gate connected to one of said second set of input lines and has a current path connected between one of said output lines and a reference voltage source, and
   (e) a plurality of logic inverter devices each connected between one of said first set of input lines and one of the n-channel field-effect transistors,
   whereby the encoded signal is supplied to said output lines in response to the logic signal on said input lines.

3. An encoder circuit for supplying an encoded signal, comprising
   (a) a plurality of input lines on which is to appear a signal consisting of bits including only one "1" signal bit, the input lines consisting of a first set of input lines and a second set of input lines respectively connected to the first set of input lines,
   (b) a plurality of output lines,
   (c) a set of p-channel field-effect transistors each of which has a gate connected to one of said first set of input lines and has a current path connected between one of said output lines and a supply voltage source,
   (d) a set of n-channel field-effect transistors each of which has a gate connected to one of said first set of input lines and has a source and a drain connected between one of said output lines and a reference voltage source, and
   (e) a plurality of logic inverter devices each connected between one of said first set of input lines and one of the p-channel field-effect transistors,
   whereby the encoded signal is supplied to said output lines in response to the logic signal on said input lines.

4. An encoder circuit for supplying an encoded signal, comprising
   (a) a plurality of input lines on which is to appear a signal consisting of bits including only one "0" signal bit, the input lines consisting of a first set of input lines and a second set of input lines respectively connected to the first set of input lines,
   (b) a plurality of output lines,
   (c) a first transistor zone within which a firt set of field-effect transistors of a first conductivity type are located, each of the first set of field-effect transistors having a gate connected to one of said first set of input lines and having a current path connected between one of said output lines and a supply voltage source,
   (d) a second transistor zone within which a second set of field-effect transistors of a second conductivity type opposite to said first conductivity type are located, each of the second set of field-transistors having a gate connected to one of said second set of input lines and having a current path connected between one of said output lines and a reference voltage source, and (e) an inverter zone within which a plurality of logic inverter devices are located, each of the logic inverters being connected between one of said first set of input lines and one of the field-effect transistors of one of said first and second sets, (f) said inverter zone intervening between said first and second transistors zones, whereby the encoded signal is supplied to said output lines in response to the logic signal on said input lines.

5. An encoder circuit as set forth in claim 4, in which said first set of field-effect transistors consist of p-channel field-effect transistors and said second set of field-effect transistors consist of n-channel field-effect transistors.

6. An encoder circuit as set forth in claim 4, in which said first set of field-effect transistors consist of n-channel field-effect transistors and said second set of field-effect transistors consist of p-channel field-effect transistors.

7. An encoder circuit comprising
(a) a first set of parallel input lines on each of which is to appear a signal with a first logic state,
(b) a second set of parallel input lines on each of which is to appear a signal with a second logic state complementary to said first logic state, the first set of input lines being respectively connected to the second set of input lines,
(c) a plurality of output lines extending in crossing relationship to said first and second set input lines,
(d) a set of transistors of a conductivity type responsive to a signal with said first logic state, each of the transistors having a control terminal connected to one of said first set of input lines and having a current path connected between one of said output lines and a reference voltage source, and
(e) a plurality of logic inverter devices each connected between one of said first set of input lines and one of the second set of input lines.

8. An encoder circuit comprising
(a) a first set of parallel input lines on each of which is to appear a signal with a first logic state,
(b) a second set of parallel input lines on each of which is to appear a signal with a second logic state complementary to said first logic state, the first set of input lines being respectively connected to the second set input lines,
(c) a plurality of output lines extending in crossing relationship to said first and second set input lines,
(d) a set of transistors of a conductivity type responsive to a signal with said second logic state, each of the transistors having a control terminal connected to one of said second set of input lines and having a current path connected between one of said output lines and a reference voltage source, and
(e) a plurality of a logic inverter devices each connected between one of said first set of input lines and one of the second set of input lines.

* * * * *